(12) United States Patent
Salman et al.

(10) Patent No.: US 7,545,109 B2
(45) Date of Patent: Jun. 9, 2009

(54) METHOD AND APPARATUS FOR MONITORING AN ELECTRICAL ENERGY STORAGE DEVICE

(75) Inventors: Mutasim A. Salman, Rochester Hills, MI (US); Nick S. Kapsokavathis, Shelby Township, MI (US); Xiaodong Zhang, Madison Heights, MI (US); David W. Walters, Sterling Heights, MI (US); Xidong Tang, Sterling Heights, MI (US)

(73) Assignee: GM Global Technology Operations, Inc., Detroit, MI (US)

( * ) Notice: Subject to any disclaimer, the term of this patent is extended or adjusted under 35 U.S.C. 154(b) by 237 days.

(21) Appl. No.: 11/736,151

(22) Filed: Apr. 17, 2007

(65) Prior Publication Data
US 2008/0150457 A1   Jun. 26, 2008

Related U.S. Application Data

(60) Provisional application No. 60/871,458, filed on Dec. 22, 2006.

(51) Int. Cl.
*H02P 1/00* (2006.01)
(52) U.S. Cl. .................................. 318/139; 388/806
(58) Field of Classification Search ................. 318/139; 388/806; 320/150
See application file for complete search history.

(56) References Cited

U.S. PATENT DOCUMENTS

| 4,937,528 | A | 6/1990 | Palanisamy |
| 5,717,314 | A * | 2/1998 | Wakefield .................... 320/150 |
| 6,445,158 | B1 | 9/2002 | Bertness |
| 6,885,167 | B2 | 4/2005 | Palanisamy |
| 7,058,525 | B2 | 6/2006 | Bertness et al. |

OTHER PUBLICATIONS

Verbrugge,M;Adaptive Energy Mgt of Electric & Hybrid Electric Vehicles; J.Electrochemical Soc 152(2) 1-0 (2005).
Cox,M; Automotive "Smart" Battery with State of Health Conductance Testing and Monitoring Technology; SAE 2003-01-0099; 2003; SAE, Warrendale, PA.

* cited by examiner

*Primary Examiner*—Karen Masih

(57) ABSTRACT

A method and article of manufacture for monitoring an electrical energy storage device adapted to supply electrical power to a selectively actuable electric motor is described. This comprises determining a state of charge and a temperature of the electrical energy storage device subsequent to a stabilization period, and measuring a minimum voltage output from the electrical energy storage device during selective actuation of the electric motor. One of a plurality of predetermined threshold voltage states is selected based upon the state of charge and the temperature. The minimum voltage is compared to the selected predetermined threshold voltage.

20 Claims, 5 Drawing Sheets

| Rb_lim(T, SOC) (mOhms) | -29°C | -18°C | 0°C | 25°C | 52°C |
|---|---|---|---|---|---|
| 100% SOC | 9.62 | 9.29 | 8.75 | 8 | 7.19 |
| 90 | 9.62 | 9.29 | 8.75 | 8 | 7.19 |
| 80 | 9.62 | 9.29 | 8.75 | 8 | 7.19 |
| 70 | 9.62 | 9.29 | 8.75 | 8 | 7.19 |
| 60 | 9.62 | 9.29 | 8.75 | 8 | 7.19 |
| 50 | 9.62 | 9.29 | 8.75 | 8 | 7.19 |
| 40 | 9.82 | 9.49 | 8.95 | 8.2 | 7.39 |
| 30 | 10.03 | 9.69 | 9.15 | 8.41 | 7.59 |
| 20 | 10.23 | 9.91 | 9.36 | 8.61 | 7.81 |
| 10 | 10.45 | 10.12 | 9.58 | 8.83 | 8.02 |

FIG. 4

| OCV(T, SOC) (Volts) | -29°C | -18°C | 0°C | 25°C | 52°C |
|---|---|---|---|---|---|
| 100% SOC | 12.565 | 12.688 | 12.775 | 12.807 | 12.832 |
| 90 | 12.454 | 12.58 | 12.673 | 12.707 | 12.727 |
| 80 | 12.339 | 12.46 | 12.569 | 12.606 | 12.621 |
| 70 | 12.222 | 12.355 | 12.463 | 12.504 | 12.515 |
| 60 | 12.101 | 12.24 | 12.356 | 12.402 | 12.407 |
| 50 | 12.977 | 12.121 | 12.248 | 12.297 | 12.298 |
| 40 | 11.848 | 12.999 | 12.137 | 12.191 | 12.187 |
| 30 | 11.711 | 12.873 | 12.024 | 12.083 | 12.073 |
| 20 | 11.559 | 11.736 | 11.905 | 11.972 | 11.954 |
| 10 | 11.373 | 11.574 | 11.77 | 11.858 | 11.828 |

FIG. 5

| Vth(T, SOC) (Volts) | -29°C | -18°C | 0°C | 25°C | 52°C |
|---|---|---|---|---|---|
| 100% SOC | 7.26 | 7.44 | 7.68 | 7.97 | 8.30 |
| 90 | 7.20 | 7.38 | 7.62 | 7.91 | 8.23 |
| 80 | 7.14 | 7.31 | 7.55 | 7.84 | 8.17 |
| 70 | 7.07 | 7.25 | 7.49 | 7.78 | 8.10 |
| 60 | 6.99 | 7.18 | 7.43 | 7.72 | 8.03 |
| 50 | 6.92 | 7.11 | 7.36 | 7.65 | 7.96 |
| 40 | 6.79 | 6.98 | 7.23 | 7.51 | 7.81 |
| 30 | 6.65 | 6.84 | 7.09 | 7.38 | 7.66 |
| 20 | 6.51 | 6.70 | 6.96 | 7.24 | 7.51 |
| 10 | 6.34 | 6.55 | 6.82 | 7.10 | 7.35 |

*FIG. 6*

METHOD AND APPARATUS FOR MONITORING AN ELECTRICAL ENERGY STORAGE DEVICE

CROSS-REFERENCE TO RELATED APPLICATIONS

This application claims priority from U.S. Provisional Application No. 60/871,458, filed Dec. 22, 2006, entitled METHOD AND ARTICLE OF MANUFACTURE FOR MONITORING AN ELECTRICAL ENERGY STORAGE DEVICE.

TECHNICAL FIELD

This invention pertains generally to electrical energy storage devices, and more particularly to a method and apparatus to determine a state of health of such devices.

BACKGROUND OF THE INVENTION

Modern vehicles are highly dependent on proper operation of systems used for electrical power generation, storage and distribution. There is a need for a reliable supply of electrical energy to operate various systems on-board each vehicle. Consistent power output from an electrical energy storage device, such as a battery, is critical for maintaining the vehicle operation. Battery problems lead to service issues and customer dissatisfaction. Therefore, there is a need to monitor an ability of a battery to deliver power throughout its life. Reliable electrical power supply is critical for vehicle operation, especially in newer vehicle systems that depend on electrical power, such as x-by-wire systems and hybrid powertrain systems. Systems which monitor electrical current and voltage during engine operation are typically noisy, making it difficult to extract battery operating parameters. Furthermore, in the event of a system fault, service personnel benefit from being able to isolate faults to effectively repair a vehicle electrical system. Thus, accurately predicting power capability of a battery and reliably identifying potential faults in a battery are important. There are several devices available in the market to test state of health of a battery, either off-line or on-line. These devices typically require additional hardware and are costly.

Therefore, there is a need for a cost-effective monitoring system for an electrical storage device that addresses the aforementioned concerns.

SUMMARY OF THE INVENTION

In accordance with an embodiment of the invention, there is provided a method for monitoring an electrical energy storage device adapted to transfer electric energy to drive an electric motor. The method comprises determining a state of charge and a temperature of the electrical energy storage device subsequent to a stabilization period. The electric motor is selectively actuated. A minimum voltage output from the electrical energy storage device during the selective actuation of the electric motor is measured. A threshold voltage state is determined based upon the state of charge and the temperature of the electrical energy storage device. A remaining useful life of the electrical energy storage device is determined based upon the minimum voltage and the threshold voltage state. These and other aspects of the invention will become apparent to those skilled in the art upon reading and understanding the following detailed description of the embodiments.

BRIEF DESCRIPTION OF THE DRAWINGS

The invention may take physical form in certain parts and arrangement of parts, an embodiment of which is described in detail and illustrated in the accompanying drawings which form a part hereof, and wherein.

DETAILED DESCRIPTION OF AN EMBODIMENT OF THE INVENTION

Figure 1:
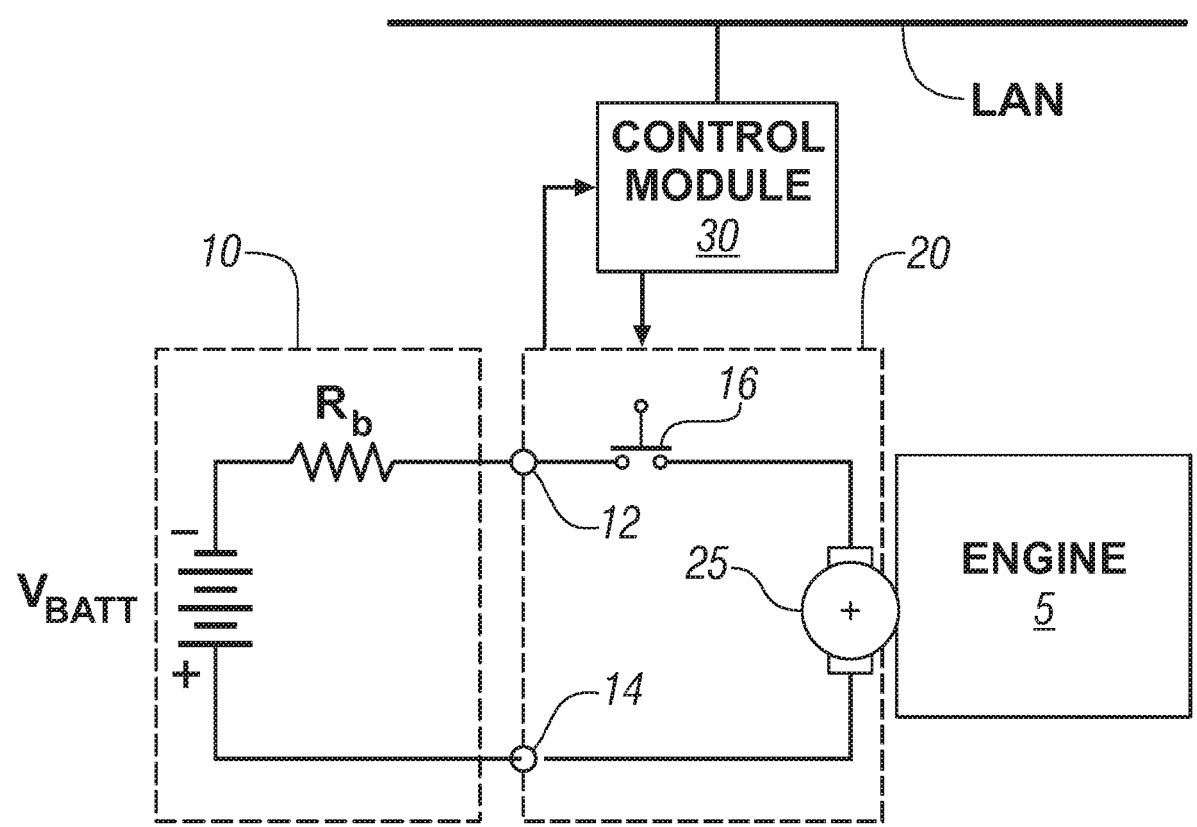
FIG. 1 is a schematic diagram of an exemplary electrical circuit, in accordance with the present invention.

Referring now to the drawings, wherein the showings are for the purpose of illustrating the invention only and not for limiting the same, FIG. 1 depicts a schematic diagram of a circuit constructed in accordance with an embodiment of the present invention. The circuit comprises an electrical energy storage device 10 (ESD) selectively electrically connected to an electrical circuit 20 including an electrically powered device 25 having an electrical connection to the ESD via a wiring harness through actuation of a switch 16. The ESD is characterized in terms of an internal battery resistance ($R_B$), an open-circuit voltage or potential (OCV), and an electrical output across terminals 12, 14 comprising a voltage Vbatt, and, an electrical current Ibatt. The internal battery resistance $R_B$ is one characteristic of an overall internal impedance that can include a frequency element that is characterized in terms of capacitance, although this is not discussed in detail herein. The electrical circuit 20 is characterized in terms of electrical impedance, including a circuit resistance (Rc). In the embodiment depicted, the ESD 10 comprises a conventional lead-acid battery selectively connected to and operative to supply electric power to the electrically powered device 25 comprising a starter motor adapted to crank an internal combustion engine 5 upon actuation of the switch 16 which comprises an ignition switch, either by a vehicle operator or in response to a command by an engine control module 30 as part of a vehicle configuration using an engine stop-start strategy.

Control module 30 is adapted to actuate the switch 16 in response to input from the vehicle operator, and monitor the electrical output measurable across terminals 12, 14. The control module is preferably a general-purpose digital computer generally comprising a microprocessor or central processing unit, storage mediums comprising non-volatile memory devices including read only memory (ROM) and electrically programmable read only memory (EPROM), random access memory (RAM), a high speed clock, analog to digital (A/D) and digital to analog (D/A) circuitry, and input/output circuitry and devices (I/O) and appropriate signal conditioning and buffer circuitry. The control module has a set of control algorithms, comprising resident program instructions and calibrations stored in memory and executable to provide the respective functions of each computer. The control module 30 can be signally connected to other control modules of an overall architecture via a local area network (LAN).

The invention comprises a method for monitoring the ESD 10 subsequent to a quiescent period, typically subsequent to a period during which the vehicle is in a key-off mode. This includes determining the open circuit voltage (OCV) and temperature (T), from which a state of charge (SOC) of the ESD is determined. A minimum voltage (Vmin) of the ESD is measured during a period when the electrical circuit discharges current through operation of the electrically powered device 25, e.g., during an engine crank/start event. The minimum voltage is compared to a threshold voltage (Vth). The threshold voltage is determined from a predetermined calibration based upon the state of charge and the temperature of the electrical energy storage device. A remaining useful life of the ESD, typically referred to as battery state-of-health, is calculated based upon the minimum voltage and the threshold voltage that was determined based upon the state of charge and the temperature of the electrical energy storage device. The method is preferably executed as an algorithm in the control module, relying upon predetermined calibration values stored tabular form in one of the memory devices of the control module. An embodiment of the method is now described in detail.

Figure 2:
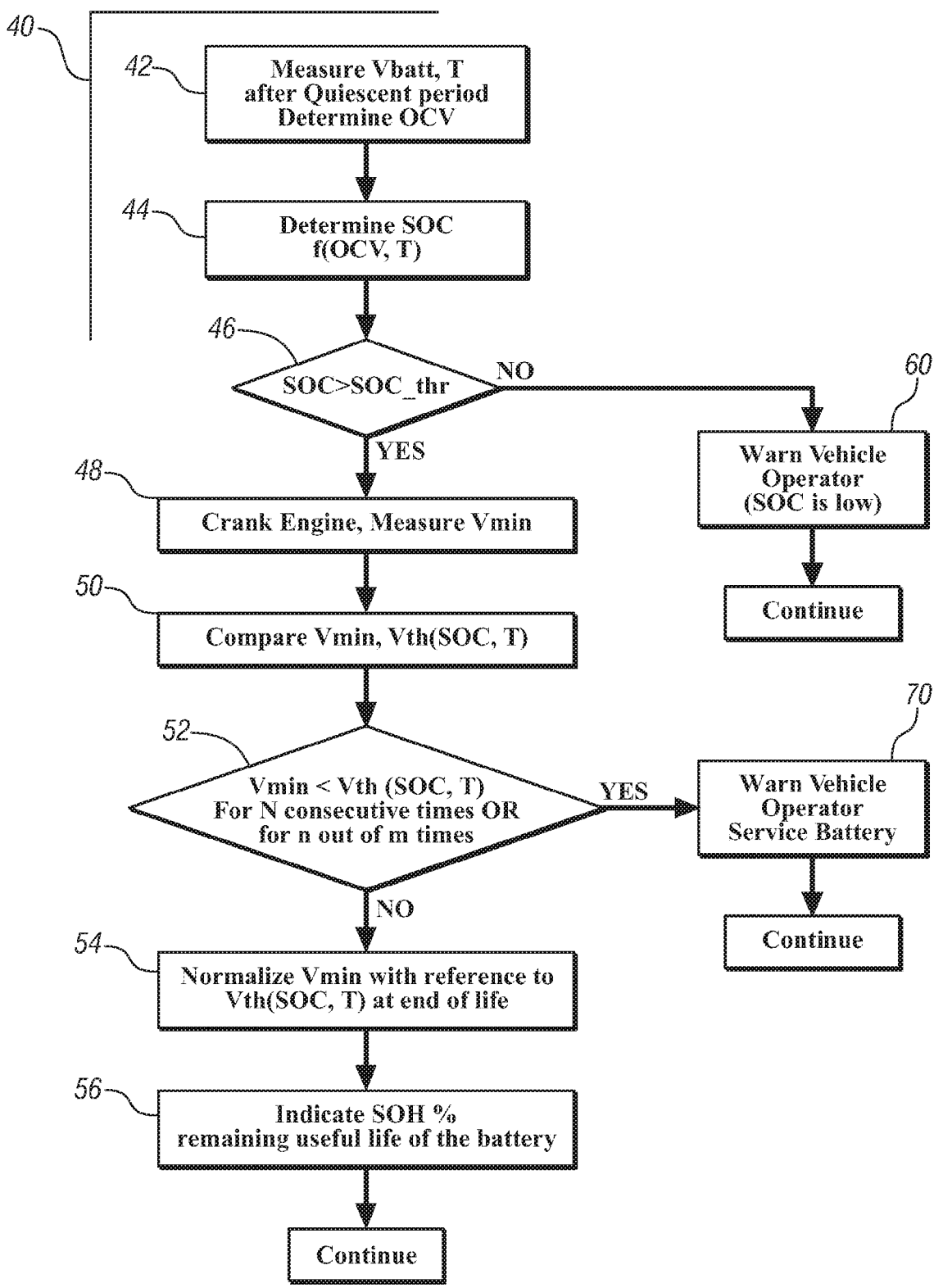
FIGS. 2 and 3 are diagrams of algorithmic flowcharts, in accordance with the present invention; and, FIGS. 4-6 are datasets in tabular form, in accordance with the present invention.

Referring now to FIG. 2, a flow chart 40 is depicted for an algorithm, preferably executed in the control module, for determining state of health of the ESD that is an element of the system constructed in accordance with FIG. 1. The system is preferably in a quiescent period wherein the system is shutoff such that there is minimal or no current flow into or out of the ESD for a predetermined period of time sufficient to stabilize various battery characteristics. The quiescent period comprises a key-off period having a duration in the range of four to six hours, and which is typically sufficient for the internal battery temperature, T, to achieve ambient temperature when the system is implemented on a vehicle, although the battery temperature does not have to reach ambient temperature for the invention to operate effectively. After a quiescent period of sufficient duration, the control module measures battery voltage, Vbatt, and electrical current, Ibatt across terminals 12, 14, and the battery temperature, T, from which it determines the open-circuit battery voltage (OCV) (Step 42). Battery voltage and temperature states are measured using known sensors and signal processing algorithms. The battery temperature state is determined by a direct measure of battery temperature using a sensor, or, alternatively, using a battery temperature estimator. An example of a battery temperature estimator comprises using engine coolant temperature as a measurement substitute or proxy temperature to approximate the battery temperature after the quiescent period in the range described above. A battery state-of-charge is determined based upon the open-circuit battery voltage and the battery temperature, using a known method for determining SOC (Step 44). The battery SOC is estimated from the battery open circuit voltage determined at the battery temperature T, typically using pre-calibrated data arranged in tabular format and stored in one of the non-volatile memory devices of the control module. When the battery SOC is lower than a predetermined threshold state-of-charge (SOC_thr) (Step 46) a warning is communicated to the operator and system operation continues (Step 60). The actions undertaken in Steps 42, 44, and 46 occur during the quiescent period prior to the actions of Step 48, and may be independent thereto.

The system is activated by actuating the switch 16 after the quiescent period. Actuating the switch 16 applies a short-duration, high-current electrical load to the battery through the electrical circuit 20, e.g., cranking the engine to start operation thereof. Battery voltage is measured during the high-current electrical load, and a minimum battery voltage (Vmin) is measured and stored in one of the memory devices (Step 48). The minimum battery voltage is compared to a corresponding threshold voltage, Vth, determined for the same temperature and SOC (Step 50). Determining the threshold voltage, Vth is described hereinbelow with reference to FIG. 3 and FIGS. 4, 5, and 6.

Results of the comparison (Step 50) are stored in a non-volatile memory device of the control module for further reference and analysis. When the minimum battery voltage is less than the corresponding threshold voltage for N consecutive times (wherein N is a calibrated number), or 'n' times out of the last 'm' cranking events (wherein n, m are calibratable), (Step 52) then a warning of impending end-of-battery life, indicating a need for the operator to service the battery, is communicated to the operator (Step 70).

Otherwise, battery state of health (SOH) is determined (Step 54), and communicated to the operator through a gauge on the vehicle dashboard or via a communication in a vehicle information center (Step 56). The battery SOH comprises a normalized calculation between the current minimum battery voltage, Vmin, and the threshold voltage value, Vth. The normalized calculation is as described with reference to Eq. 1:

$$\frac{V_{min}(T, SOC) - V_{th}(T, SOC)}{V_{min,new}(T, SOC) - V_{th}(T, SOC)}. \quad [1]$$

The battery SOH is calculated as either one of a linear and an exponential function of the normalized calculation between the current minimum battery voltage, Vmin, and the threshold voltage value, Vth. A linear function is shown with reference to Eq. 2:

$$SOH = \left(\frac{V_{min}(T, SOC) - V_{th}(T, SOC)}{V_{min,new}(T, SOC) - V_{th}(T, SOC)}\right) * 100\%; \quad [2]$$

wherein $V_{min}$(T,SOC) comprises the measured minimum voltage. The value $V_{min,new}$(T,SOC) comprises the measured minimum voltage determined when the battery is new, and $V_{th}$(T,SOC) comprises the value of the minimum voltage threshold. When the battery is new, the SOH is 100%. As the battery ages, the SOH decreases, approaching a normalized SOH of 0%.

Figure 3:
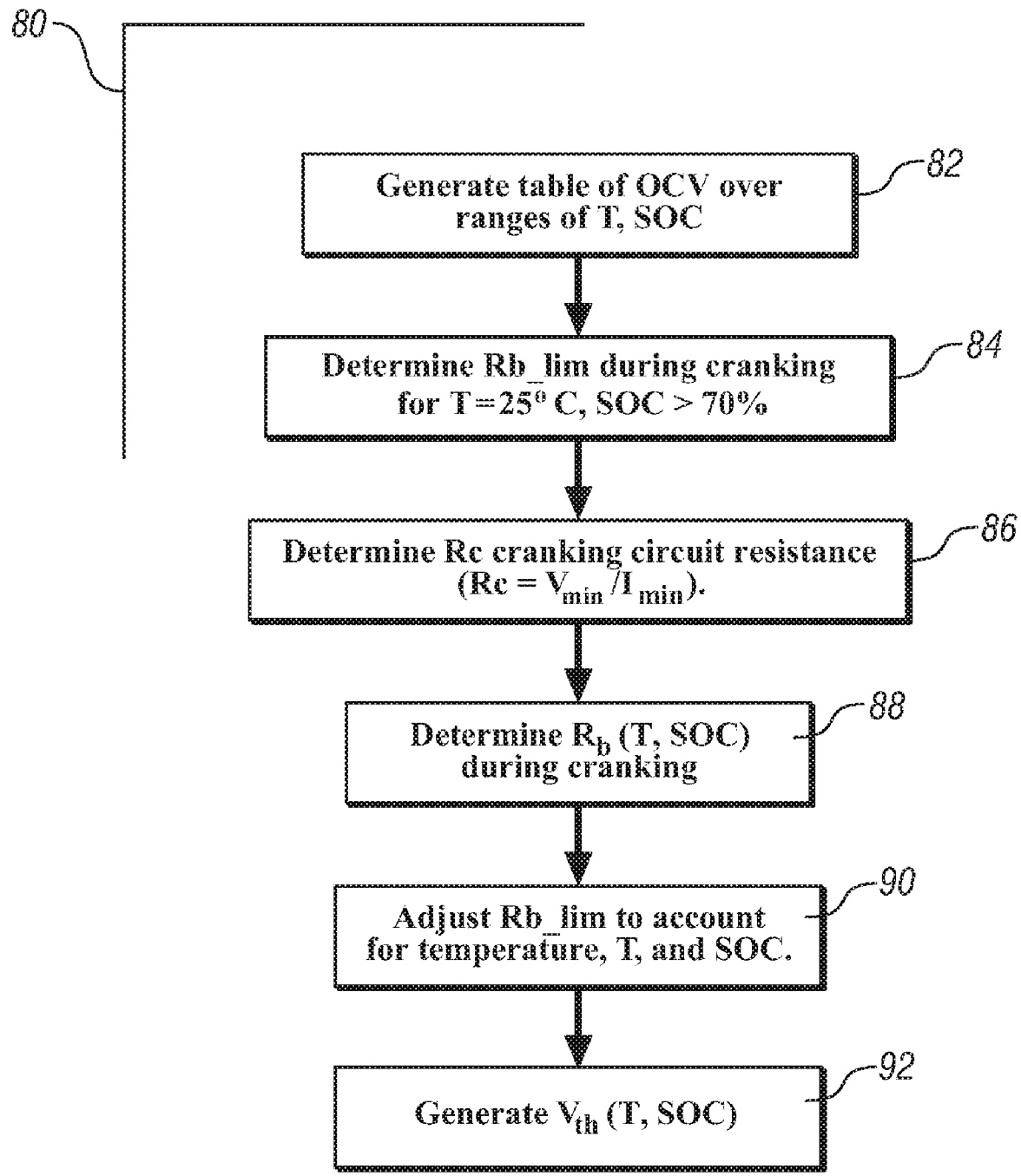

Referring now to FIG. 3, a flowchart 80 is depicted for constructing the battery minimum voltage threshold, $V_{th}$(T, SOC), which is determinable based upon battery temperature and state of charge. Some of the steps and actions described with reference to FIG. 3 are conducted off-line during system development to generate data which is used to construct calibration tables for storage and subsequent implementation in the control module for use by the algorithm. The battery open circuit voltage table is determined (in Volts), based upon a predetermined calibration of battery temperature and SOC (Step 82). An exemplary dataset comprising a plurality of open circuit voltage states for a typical nominal 12-Volt battery device across ranges of battery temperature state, T and SOC, is depicted in tabular form with reference to FIG. 5.

A critical or limit battery resistance (Rb_lim) is determined during cranking at normalized operating conditions, e.g., at 25° C., and at a high SOC (e.g., above 70%) (Step 84). In a circuit such as depicted with reference to FIG. 1, the exemplary battery 10 for the cranking circuit 20 can have a limit battery resistance value (Rb_lim) of about 8 mOhms. The limit battery resistance is typically determined through extensive accelerated aging testing to determine the resistance value beyond which the battery is likely not capable of effectively cranking the engine, even at high SOC and temperature at or above a nominal temperature.

The cranking motor circuit resistance Rc, not including the battery resistance Rb, is determined (Step 86). The cranking motor circuit resistance Rc comprises resistance of circuit 20 and comprehends and includes all the components thereof, including wiring harness cable, motor brushes, and other components, and is preferably determined during standardized cranking testing occurring during preproduction vehicle calibration and development. The cranking motor circuit resistance Rc is typically calculated as the minimum cranking voltage divided by a minimum electrical current (Imin) occurring during the crank, i.e., Vmin/Imin. The cranking motor circuit resistance Rc typically varies depending upon temperature of the cranking motor circuit. A reasonable value for the exemplary system has been determined to be 13.2 mOhm for an embodiment of the system depicted in FIG. 1.

The limit battery resistance, Rb_lim can vary during cranking based upon temperature and SOC. In the example, battery resistance Rb_lim increases by 0.03 mOhm for a one degree (C) decrease in temperature; and increases by 2.5% for a 10% decrease in SOC below 50%. Thus, the limit battery resistance is adjusted to account for different temperature states and SOC. Using a battery resistance of 8 mOhm for the high SOC (25° C. point), a calibration dataset for battery resistance, Rb is generated. Battery resistance variability during cranking, in relationship to battery temperature state and SOC, is determined (Step 88). Referring now to FIG. 4, an exemplary dataset in tabular format is depicted which comprises a plurality of limit battery resistance states (Rb_lim), in mOhms, determined over ranges of temperature states, T, and SOC (Step 90).

The limit battery resistance is adjusted to account for battery temperature and SOC. Based upon the information described, threshold minimum battery voltage states $V_{th}$(T, SOC) is determined and adjusted for the ranges of temperature states, T, and SOC. An exemplary equation to determine $V_{th}$ is depicted with reference to Eq. 3, below:

$$V_{th} = \frac{OCV(T, SOC) * Rc(T)}{Rb\_lim(SOC, T) + Rc(T)} \quad [3]$$

Eq. 3 is executed to generate a plurality of values for $V_{th}$(T,SOC) over the ranges of temperature states and SOC, resulting in a calibration in tabular form that is stored in one of the non-volatile memory devices of the control module (Step 92). Referring now to FIG. 6, a predetermined calibration illustrative of the concept is depicted in tabular form for the exemplary system described herein, based upon the data of FIGS. 4 and 5. The exemplary system has a threshold voltage, Vth, ranging from 8.30 Volts to 6.34 Volts, depending upon the battery temperature state T, and battery SOC.

Referring again to Steps 50, 52, and 54 of FIG. 2, the measured Vmin is compared to the threshold voltage, Vth, for the temperature and SOC, and the results of the comparison are stored for further analysis. When the minimum battery voltage is less than the corresponding threshold voltage, a warning of impending end of battery life is communicated to the operator. Furthermore, a parameter representing battery state-of-health is determined and communicated or otherwise indicated to the system operator.

The invention has been described with specific reference to the preferred embodiments and modifications thereto. Further modifications and alterations may occur to others upon reading and understanding the specification. It is intended to include all such modifications and alterations insofar as they come within the scope of the invention.

Having thus described the invention, it is claimed:

1. Method for monitoring an electrical energy storage device adapted to transfer electric energy to drive an electric motor, comprising:

determining a state of charge and a temperature of the electrical energy storage device subsequent to a stabilization period;

selectively actuating the electric motor;

measuring a minimum voltage output from the electrical energy storage device during the selective actuation of the electric motor;

determining a threshold voltage state based upon the state of charge and the temperature of the electrical energy storage device; and, determining a remaining useful life of the electrical energy storage device based upon the minimum voltage and the threshold voltage state.

2. The method of claim 1, wherein determining the threshold voltage state based upon the state of charge and the temperature of the electrical energy storage device comprises selecting one of a plurality of predetermined threshold voltage states based upon the state of charge and the temperature.

3. The method of claim 2, further comprising:

determining a plurality of open circuit voltage states of the electrical energy storage device across a range of states-of-charge and a range of temperature states;

determining a limit resistance of the electrical energy storage device;

determining a resistance of the electric motor during the discharge event; and, calculating a plurality of threshold voltage states, each threshold voltage state calculated based upon the plurality of open circuit voltage states, the limit resistance of the electrical energy storage device, and the resistance of the electric motor during the discharge event across the range of the states-of-charge and the range of temperature.

4. The method of claim 3, wherein the resistance of the electric motor is determined during the discharge event based upon temperature of the electric motor circuit.

5. The method of claim 3, wherein the limit resistance of the electrical energy storage device comprises a resistance value beyond which the electrical energy storage device is not capable to drive the electric motor.

6. Method for monitoring a battery adapted to supply electrical power to an electric motor adapted to crank an internal combustion engine, comprising:

determining a state of charge and a temperature of the battery subsequent to a stabilization period;

measuring a minimum voltage output from the battery during engine cranking;

selecting one of a plurality of predetermined threshold voltage states based upon the state of charge and the temperature of the battery;

comparing the minimum voltage output measured from the battery during engine cranking to the selected predetermined threshold voltage state; and, calculating a remaining useful life of the battery based upon the minimum voltage and the threshold voltage determined based upon the state of charge and the temperature of the battery.

7. The method of claim 6, further comprising determining the plurality of predetermined threshold voltage states based upon the state of charge and the temperature of the battery, comprising:

determining a plurality of open circuit voltage states of the battery across a range of states-of-charge and a range of temperature states;

determining a limit resistance of the battery;

determining a resistance of a cranking system comprising the electric motor during the discharge event;

calculating a plurality of threshold voltage states based upon the plurality of open circuit battery voltage states, the limit resistance of the battery, and the resistance of the cranking system during the discharge event across the range of the states-of-charge and the range of temperature states.

8. The method of claim 6, further comprising informing a vehicle operator when the minimum voltage value is less than the threshold value.

9. The method of claim 6, further comprising informing a vehicle operator when the minimum voltage value is less than the threshold value for a predetermined number of engine start cycles.

10. The method of claim 6, wherein determining a state of charge and a temperature of the battery subsequent to a stabilization period comprises:
    executing the method only after a delay of an elapsed period of time sufficient for the battery to reach ambient temperature.

11. The method of claim 10, wherein the delay of an elapsed period of time sufficient for the battery to reach the ambient temperature comprises a period in a range of six to ten hours.

12. The method of claim 11, further comprising determining the resistance of the cranking system during the discharge event based upon the ambient temperature.

13. The method of claim 7, wherein the limit resistance of the battery comprises a resistance value beyond which the battery is not capable to drive the electric motor to crank the engine at the state of charge and the temperature of the battery.

14. The method of claim 13, wherein determining the limit resistance of the battery comprises selecting one of a plurality of precalibrated limit resistances of the battery based upon the temperature and the state-of-charge.

15. Article of manufacture, comprising a storage medium having machine-executable code encoded therein to monitor a state of health of a battery adapted to supply electrical power to an electric motor adapted to crank an internal combustion engine, the code comprising:
    code to determine a state of charge and a temperature of the battery subsequent to a stabilization period;
    code to measure a minimum voltage output from the battery during engine cranking;
    code to compare the minimum voltage output from the battery during engine cranking to a threshold voltage determined based upon the state of charge and the temperature of the battery; and,
    code to calculate a remaining useful life of the battery based upon the minimum voltage and the threshold voltage determined based upon the state of charge and the temperature of the battery.

16. The article of claim 15, wherein the code to determine the threshold voltage comprises a predetermined calibration stored therein the calibration comprising a plurality of threshold voltage states each of the threshold voltage states corresponding to a state of charge and the temperature of the battery.

17. The article of claim 15, further comprising a process to determine the predetermined calibration based upon the state of charge and the temperature of the battery, comprising:
    determining a plurality of open circuit voltage states of the battery determined across a range of battery states-of-charge and a range of temperature states;
    determining a limit resistance of the battery; and,
    determining a resistance of the cranking system during engine cranking; and,
    calculating a plurality of threshold voltage states based upon the plurality of open circuit battery voltage states, the limit battery resistance, and the resistance of the cranking system during the discharge event across the range of the states-of-charge and the range of temperature states.

18. The article of claim 17, wherein the plurality of threshold voltage states are calculated across the range of battery states-of-charge and the range of temperature states, each threshold voltage based upon the open circuit battery voltage states, the limit battery resistance during engine cranking, and the resistance of the cranking system thereat.

19. The article of claim 15, further comprising code to calculate an index representative of battery state-of-health based upon the minimum voltage and the selected predetermined threshold voltage.

20. The article of claim 19, further comprising code to communicate the index representative of the battery state-of-health to an operator.

* * * * *